United States Patent [19]
Takahashi

[11] Patent Number: 5,697,751
[45] Date of Patent: Dec. 16, 1997

[54] WAFER TRANSFER APPARATUS AND METHOD

[75] Inventor: Kazue Takahashi, Kudamatsu, Japan

[73] Assignee: Hitachi, Ltd., Tokyo, Japan

[21] Appl. No.: 445,863

[22] Filed: May 22, 1995

[30] Foreign Application Priority Data

May 20, 1994 [JP] Japan .................... 6-106444

[51] Int. Cl.$^6$ .................... H02N 13/00
[52] U.S. Cl. .................... 414/222; 29/25.01; 414/936
[58] Field of Search .................... 414/935, 936, 414/938, 222; 198/347.3; 29/25.01

[56] References Cited

U.S. PATENT DOCUMENTS

| | | | |
|---|---|---|---|
| 4,449,885 | 5/1984 | Hertel et al. .................... | 414/936 |
| 4,520,421 | 5/1985 | Sakitani et al. . | |
| 4,565,601 | 1/1986 | Kahehi et al. . | |
| 4,743,570 | 5/1988 | Lamont, Jr. . | |
| 4,892,451 | 1/1990 | Mahler .................... | 414/938 |
| 4,911,597 | 3/1990 | Maydan et al. .................... | 414/939 |
| 4,962,441 | 10/1990 | Collins .................... | 118/500 |
| 4,999,507 | 3/1991 | Clemens .................... | 361/234 |
| 5,007,981 | 4/1991 | Kawasaki et al. . | |
| 5,113,992 | 5/1992 | Sadamari .................... | 198/347.3 |
| 5,258,047 | 11/1993 | Tokisue et al. . | |
| 5,315,473 | 5/1994 | Collins et al. .................... | 361/234 |

FOREIGN PATENT DOCUMENTS 0246117  11/1987  European Pat. Off. .

Primary Examiner—Karen B. Merritt
Assistant Examiner—Gregory A. Morse
Attorney, Agent, or Firm—Evenson McKeown Edwards & Lenahan, PLLC

[57] ABSTRACT

Transfer and processing of semiconductor wafers are performed while maintaining the wafer surfaces in a vertical orientation by holding the water substrate with electrostatic chucking of the rear face thereof. Thereby, the floor area of the transfer and processing system becomes almost the same regardless of the wafer size. Because only the back of the wafer comes in contact with a transfer member, the wafer front surface is kept clean and moreover wafer transfer can be done quickly.

11 Claims, 6 Drawing Sheets

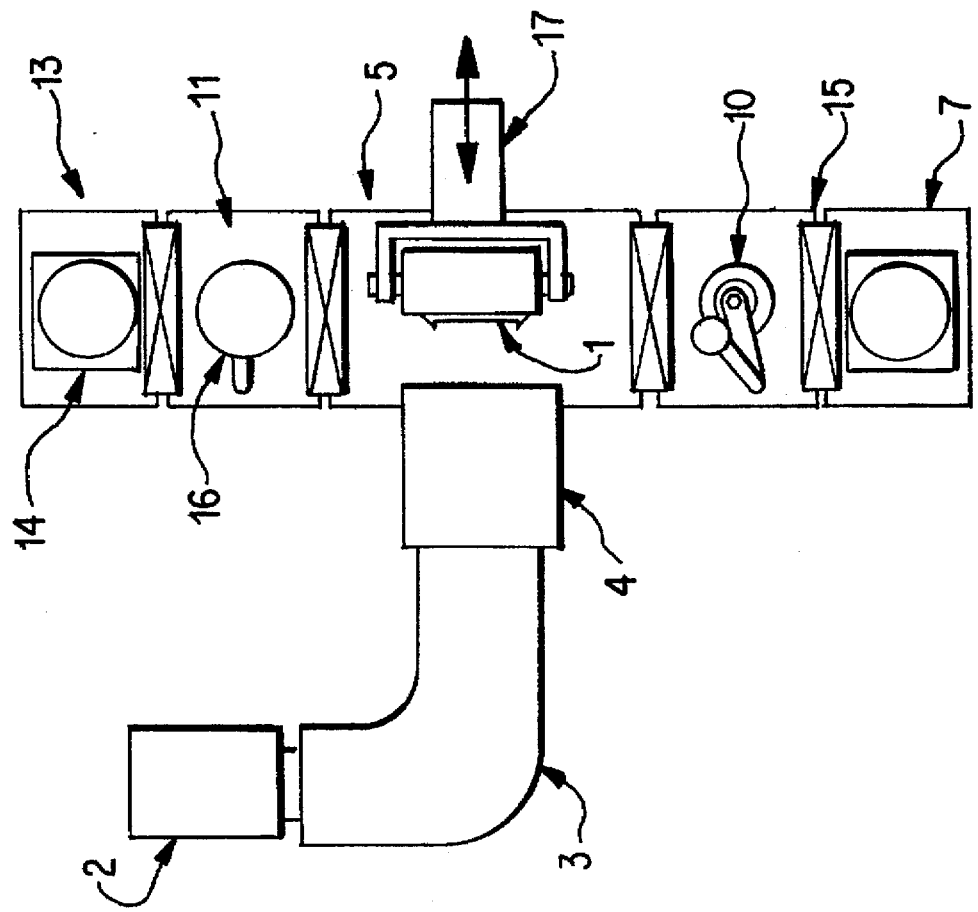
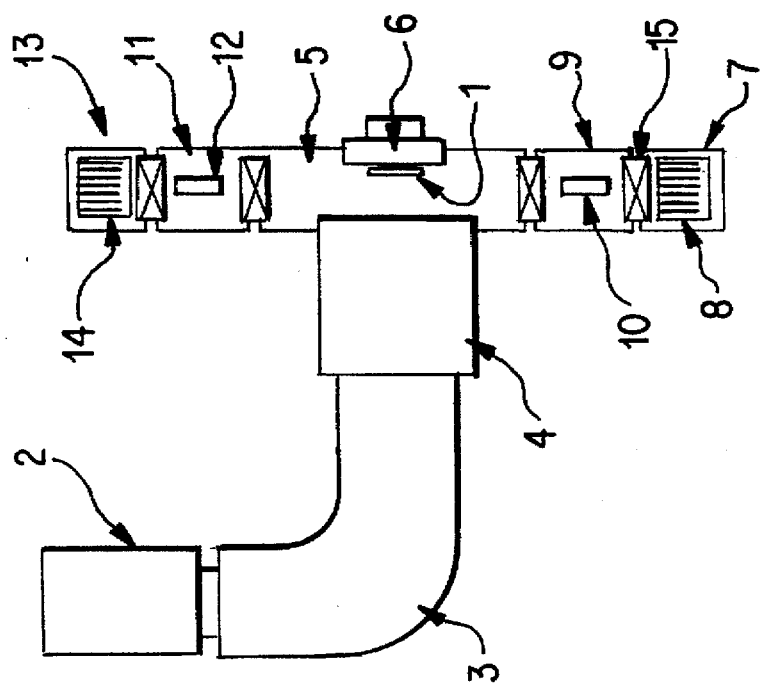

5,697,751

WAFER TRANSFER APPARATUS AND METHOD

BACKGROUND AND SUMMARY OF THE INVENTION

The present invention relates to a semiconductor wafer transfer apparatus and method for a wafer processing system. The present invention is particularly directed toward arrangements for minimizing the "footprint" installation area of the wafer processing system so as to minimize the area of a clean room even for increased wafer sizes. The present invention also relates to wafer transfer arrangements minimizing the number of foreign matters adhering to a wafer during processing thereof.

In general, in wafer transfer method of wafer processing systems, starting with the state in which wafers are stored in a cassette with their surfaces horizontal, the wafer is placed on a wafer transfer arm with the wafer surface horizontal, the wafer is transferred to a processing chamber to deliver it to a wafer processing holder, and the wafer is unloaded after it is processed. During the above steps, the wafer surface is kept horizontal in prior art arrangements. For example, a wafer substrate is transferred between chambers (e.g., transfer chamber and processing chamber) by a transfer arm having joints, with the wafer surface maintained horizontal. Moreover, a cassette for storing a plurality of wafers, transferring the wafers to another processing apparatus and loading them in the apparatus is placed on wafer loading and unloading sections so that the wafer surfaces are horizontal. This constitution has an advantage that unnecessary force does not act on the wafer and a wafer transfer mechanism is also simplified because the gravity can be used to hold the wafer. However, these arrangements have a problem in that the installation area of the apparatus increases proportionally to the wafer size as the wafer size increases.

U.S. Pat. No. 5,007,981 discloses a system of removing residual corrosive compounds by plasma etching a wafer followed by washing. Referring to FIG. 2 of this patent, the transfer and processing of the wafers occurs while maintaining the wafers in a horizontal position. U.S. Pat. No. 4,565,601 discloses a system with a horizontal wafer and a holding arrangement with temperature control using cooling water.

As an example in which the wafer surface is not horizontal but vertical (the normal to the wafer surface is horizontal), U.S. Pat. No. 4,743,570 discloses the method in which wafer pre-processing and processing chambers are provided on substantially the same plane and wafers are transferred while vertically moving from chamber to chamber with their surface vertical. In this method, it is hardly necessary to increase the apparatus size in the wafer thickness direction even if the wafer diameter increases. However, because it is necessary to increase the dimensions of the wafer processing chamber in accordance with the wafer size in the wafer surface, the overall size of the system in the vertical plane increases proportionally to the increase of the wafer size. Particularly, when the ceiling height of the clean room is limited, the apparatus cannot be stored in the clean room in the future if the wafer size will increase.

The semiconductor wafer size has been gradually increasing. Therefore, the size of a wafer processing apparatus has also been steadily increasing. Moreover, though 8" wafers are popular at present, it is considered that 12" and 16" wafers will be used in the future. In this case, if wafers are transferred with their surface horizontal, the size of the wafer processing apparatus also increases as the wafer area increases. For example, because the wafer area ratio is $8^2:12^2:16^2$ (inch)=1:2.25:4, the footprint of the apparatus for 16" wafers has a value four times as large as that of 8" wafer apparatus. This value is practically unacceptable because it would require complete remodeling of the clean room so that the investment for the clean room greatly increases in order to construct a next-generation wafer processing line, and the investment may not be recovered depending on the speed of generation change.

It is an object of the present invention to provide a wafer transfer method and a wafer transfer apparatus for preventing the installation area of a wafer processing apparatus from increasing due to the increase of the wafer diameter and moreover preventing the area of the clean room and the cost of a wafer processing apparatus from increasing.

Because wafers are transferred or processed with their surfaces horizontal, the area of the wafer processing apparatus (area of the processing apparatus projected to the floor; footprint) increases as the diameter of the wafers (wafer area) increases. Wafers are usually transferred and processed with their surfaces horizontal because the structure of a transfer system can be simplified by placing a wafer on a transfer jig or a holding device to handle the wafer without securing the wafer to the jig or handling device by contact members engaging the wafer surface to be processed. If some contact member is necessary for the processed surface of the wafer or the wafer is mechanically secured or held, foreign matters may frequently be produced from the contact member or the mechanical holder. Thus it would be preferable to transfer wafers with their surface vertical in view of prevention of foreign matters from adhering to the wafer surfaces. Holding of wafers in a vertical orientation by mechanical holding devices involves some contact members engaging, and therefore potentially contaminating the surface to be processed.

If wafers can be transferred with their surfaces vertical, the footprint of a wafer processing apparatus can be small and kept unchanged regardless of the wafer size. If a wafer can be secured to a transfer jig or the like without contact with the processed surface or the outer periphery of the wafer while the wafer surface is kept vertical, as contemplated by the present invention, it is possible to decrease the amount of foreign matter adhering to the wafer surface. The present invention advantageously uses electrostatic attraction for holding the wafers in a vertical orientation and for maintaining the vertical orientation during transfer and processing operations. Because in the case of electrostatic attraction the back of a wafer can be attracted and held, no scratches due to contact are produced on the wafer surface to be processed and no foreign matter adheres to that wafer surface. Therefore, the electrostatic attraction systems of the present invention are quite advantageous.

The thickness of a wafer is small compared to the diameter of the substrate. For example, even if the wafer diameter increases from 8 inches to 16 inches, and the wafer thickness also increases according to the increase of the wafer diameter, the wafer thickness becomes 1 to 2 mm at most. Therefore, it is unnecessary to consider the increase of the wafer diameter for the footprint of a transfer system in which wafers are kept vertical, compared to the increase of the footprint of a transfer system in which wafers are transferred with their surfaces horizontal. Moreover, the electrostatic attraction does not require the adjustment of the attracted surface in accordance with the size of the wafer, and the wafer can be attracted and held only by the contact of an electrostatic chucking device with a part of the back of the wafer. Therefore, the electrostatic attraction can be used without special consideration even if the diameter of the wafer increases. Thus the same basic electrostatic chucking device or devices can be used for different size wafers. The use of electrostatic attraction is also advantageous in that the system can operate to hold the wafers under vacuum conditions that exist in the wafer processing and transfer stations.

Other objects, advantages and novel features of the present invention will become apparent from the following detailed description of the invention when considered in conjunction with the accompanying drawings.

BRIEF DESCRIPTION OF THE DRAWINGS

FIG. 1 is an illustration of an ion implanter, constructed according to a preferred embodiment of the present invention;

FIG. 2 is an illustration of a conventional ion implanter;

DETAILED DESCRIPTION OF THE DRAWINGS

Figure 3:
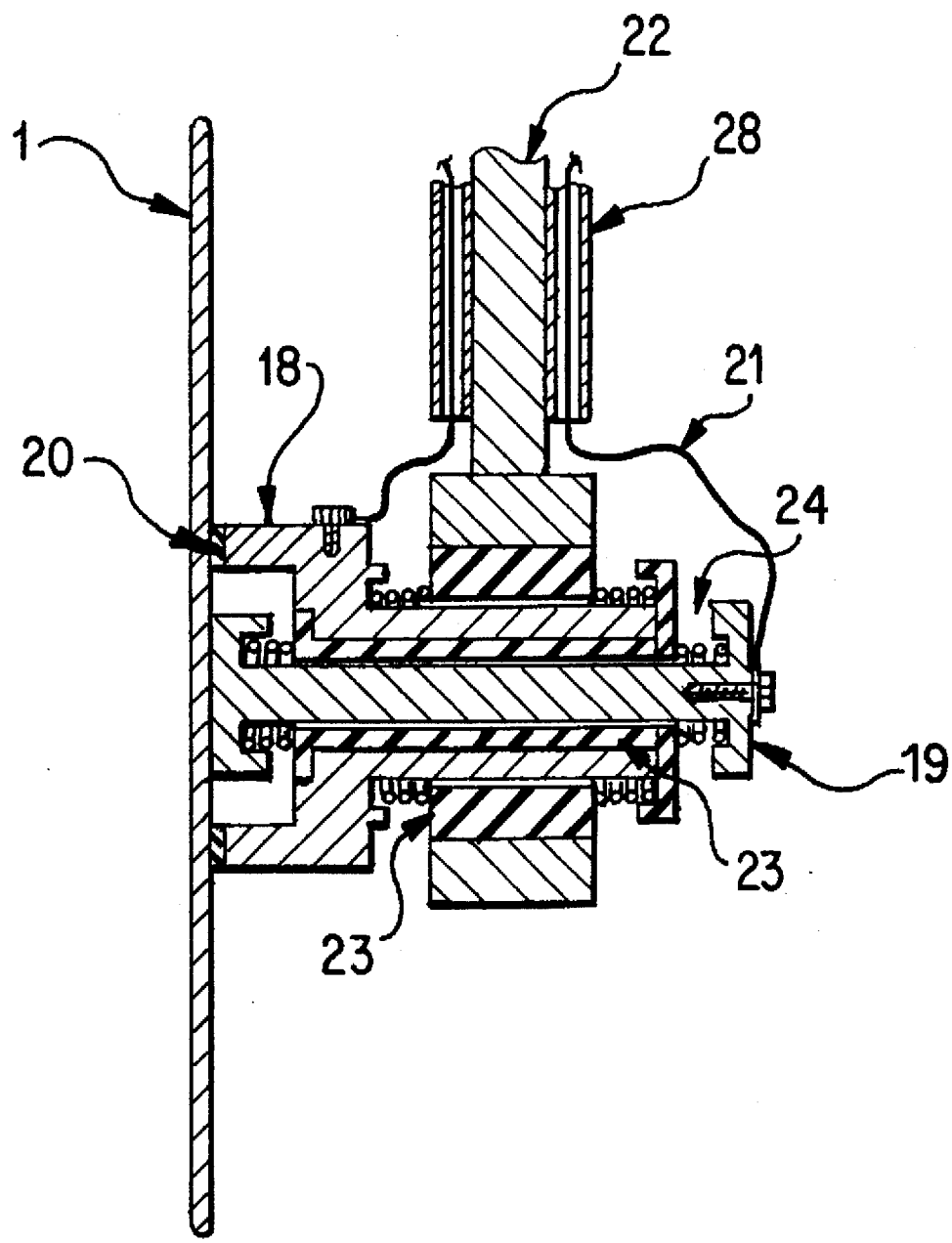
FIG. 3 is a schematic sectional view of an electrostatic attraction section of a wafer chucking device constructed according to a preferred embodiment of the present invention and usable with the ion implanter system of FIG. 1.

FIG. 1 shows an application example of the present invention, which is an ion implanter. It is a matter of course that similar results can be obtained even when the wafer processing chamber is not an ion implantation chamber but a sputtering apparatus, etching apparatus, or film forming apparatus.

In FIG. 1, a wafer 1 is made of silicon and boron, phosphorus, arsenic, antimony, or the like is implanted into the wafer 1 as dopant ions. These ions are produced by an ion source 2, impurity elements are removed by a mass spectrometry section 3, a predetermined energy is given to the ions by an accelerating tube 4, and the ions are implanted into the surface of the wafer 1 held by a wafer holding device 6 provided in a wafer processing chamber 5. In this case, to uniformly implant ions into each portion of the wafer 1, the wafer 1 may be rotated or moved. The wafer 1 is driven by the wafer holding device 6. To efficiently implant a lot of ions into the wafer 1, a wafer transfer system for loading the wafer 1 into the wafer processing chamber 6 to process it and thereafter unloading it is necessary. It is to be understood that the term "wafer" refers to a silicon layer supported on a substrate such as aluminum.

FIG. 1 shows an example of a so-called single wafer processing in which wafers 1 are loaded and processed in the wafer loading chamber 5 one by one. However, in the case of batch wafer processing in which a plurality of wafers are simultaneously processed in a wafer processing chamber, not only the necessary floor area of the apparatus increases but also it is technically more difficult to hold wafers and to increase the size of the wafer driving system in a wafer processing system capable of dealing with the increase of wafer diameter at which the present invention aims. Therefore, the single wafer processing as shown in FIG. 1 is an important technique for a large-diameter wafer processing system.

If a wafer 1 of large diameter is transferred with its surface horizontal, a system with similar processing features as that of FIG. 1 has a constitution as schematically shown in FIG. 2. Both FIGS. 1 and 2 are top views of the apparatuses. That is, the outline of the system of the top view directly corresponds to the required floor area of the system or the "footprint" of the system.

In the case of FIG. 1, a cassette 8 is loaded in a wafer loading chamber 7. A plurality of 8" wafers (e.g., twenty-five 8" wafers) are stored in the cassette 8. The wafers 1 are taken out of the cassette 8 one by one by a transfer arm assembly 10 provided in a buffer chamber 9 and transferred into the wafer processing chamber 5 where ion implantation is performed. Thereafter, the wafer 11 is taken out by a transfer arm assembly 12 provided in a buffer chamber 11 and stored in a cassette 14 in a wafer unloading chamber 13. After the processing of the wafers stored in the cassette 8 are completed, the cassette 14 storing the wafers is taken out of the wafer unloading chamber 13 and thus a series of steps is completed. During the above steps, the pressure of the wafer processing chamber 5 is kept in a high vacuum state equal to or lower than $10^{-5}$ Pa ($\approx 10^{-7}$ millibar) in order that ion implantation is not obstructed or impurity elements are not implanted.

To quickly execute wafer transfer between chambers under atmospheric pressure and in the high vacuum state, the wafer loading chamber 7, buffer chamber 9, wafer processing chamber 5, buffer chamber 11, and wafer unloading chamber 13 are isolated from each other by valves 15, and the valves 15 are opened or closed when necessary. Each chamber is evacuated up to a predetermined pressure by a vacuum pump.

In the system of FIG. 1, because a wafer is transferred with its surface vertical, the dimension in the lateral direction (thickness direction of the wafer) in FIG. 1 only depends on the size of a wafer arm or the like the system footprint size is not greatly influenced by the size of the wafer. In the case of the prior art horizontal wafer transfer system shown in FIG. 2, however, the system footprint size in the horizontal direction (the floor area of the apparatus) is substantially increased due to an increased size of the wafer 1, although the system of the apparatus is otherwise substantially similar to as that of FIG. 1. Moreover, when it is necessary to process a wafer 16 while holding the processed surface vertical using this system of FIG. 2, the direction of posture of the horizontally transferred wafer 16 must be changed from horizontal to vertical by using the wafer holding device 17. Therefore, the system of FIG. 2 is mechanically more complicated.

Thus, it has been found that a system for transferring a wafer maintained vertical has an advantage of preventing the floor area of the apparatus from increasing even if the wafer diameter increases. To realize the system, a technique for transferring a wafer while keeping it vertical is necessary. FIG. 3 shows an example of an electrostatic wafer chucking device constructed according to the invention. In FIG. 3, a cross section of a wafer transfer arm assembly is shown, in which a wafer is held by electrostatic attraction. The wafer is electrostatically attracted by applying a high DC voltage between electrodes 18 and 19. An electrostatic attraction member 20 made of an insulating material such as alumina is secured to the portion of the electrode 18 corresponding to the back of the wafer 1. The portion of the electrode 19 corresponding to the back of the wafer 1 is made of a good electrical conductor. Though not illustrated in FIG. 3, an acicular projection may be formed on the surface of the electrode 19 when the back of the wafer 1 is covered with silicon oxide or the like and consequently not electrically conductive. The electrodes 18 and 19 are connected to a lead wire 21 and a high voltage is applied between the electrodes 18 and 19.

The electrodes 18 and 19 are held by an arm 22 to be movable relative to one another in the direction normal to the wafer 1 so as to prevent the wafer 1 from being damaged or broken due to an excessive force, even when the arm 22 moves in the direction normal to the surface of the wafer 1. The electrodes 18 and 19 inserted into a sleeve 23 made of a slidable and insulating material are pressed by a spring 24 from the front and back. Thereby, the electrodes 18 and 19 are movable in their axial direction against the resistance of the spring 24. The reason why the resistance by the spring 24 is imparted is that, if the electrodes move excessively freely, a problem occurs in that the position of the wafer 1 is not fixed during the wafer transfer, or the necessary alignment when the wafer 1 is delivered to another wafer holding device from the transfer arm does not result. Therefore, the spring 24 is provided in order to keep the electrodes 18 and 19 at the same position after the wafer 1 is electrostatically attracted. The spring 24 and the permitted movement of the electrodes provides for a "soft" chucking of the wafer thereby minimizing and any chuck inflicted damage to the wafer.

Though not illustrated in FIG. 3, the electrodes 18 and 19 are secured by a key or the like so that they cannot move in the rotational direction.

Though the electrodes 18 and 19 of FIG. 3 are independently movable, an embodiment is also contemplated where the electrodes are moved as one body by constituting them into one body. Specifically, it is necessary to remove the sleeve 23 and the spring 24 from the electrode 19 and secure the electrodes 18 and 19 by putting an electrically insulating material between them.

Figure 4:
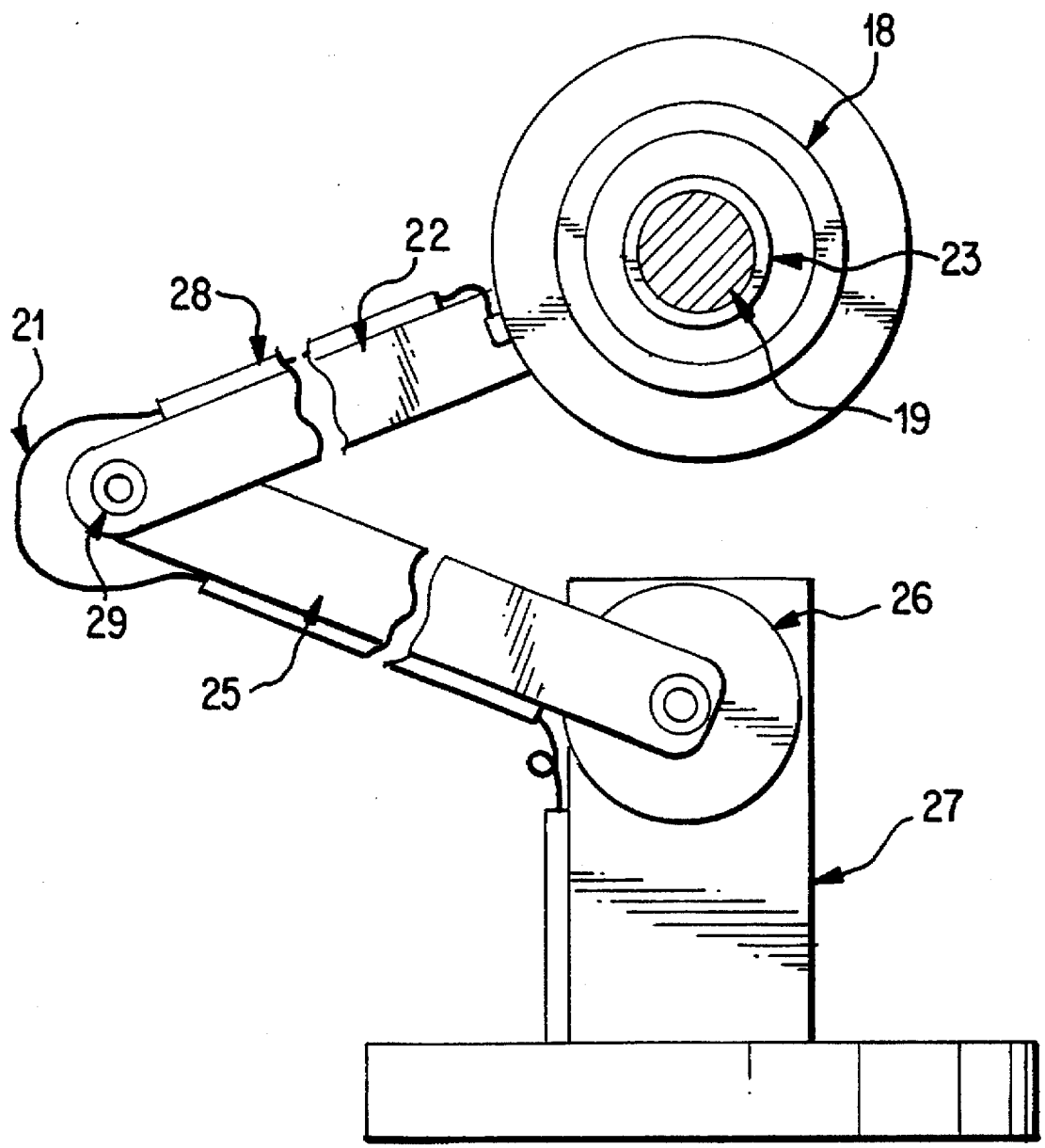
FIG. 4 is a front schematic view of a transfer arm assembly of the wafer chucking and transfer system of FIGS. 1 and 3.

FIG. 4 schematically shows an entire wafer transfer arm assembly having the electrostatic attraction mechanism shown in FIG. 3. In FIG. 4, the electrodes 18 and 19 are provided at the front end of the arm 22, connected to an arm driving section 26 through another arm 25, and supported by a support 27. The arms 22 and 25 are provided with the lead wire 21 and its guide 28 for applying a high DC voltage necessary for electrostatic attraction and its guide 28. The arms 22 and 25 can be freely moved by the arm driving section 26 in the plane of FIG. 4. An arm joint 29 can also rotate.

Figure 5:
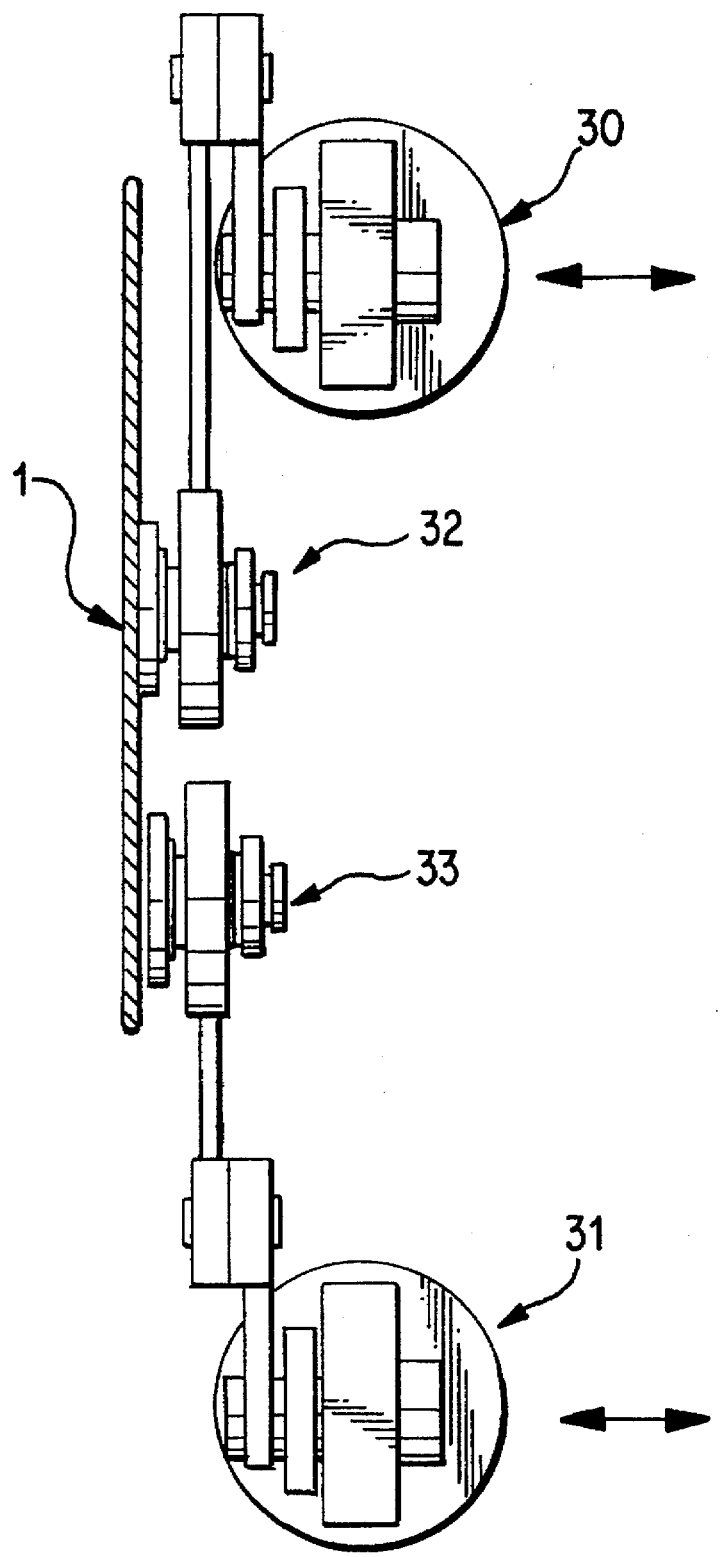
FIG. 5 is a schematic illustration of wafer delivery using a transfer system with two electrostatic wafer chucking devices arranged according to a preferred embodiment of the present invention.
Figure 6:
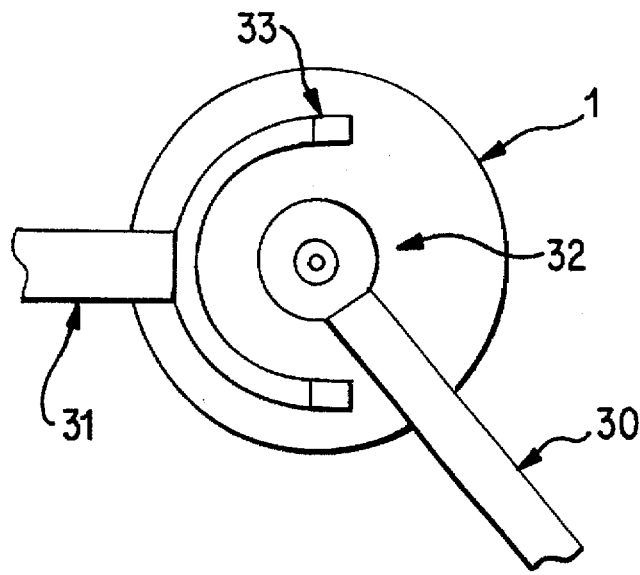
FIG. 6 is a schematic illustration showing the position of the chucking devices of the system of FIGS. 1, and 3–5, showing wafer delivery using the transfer system of the present invention.

In FIG. 5 a wafer is shown delivered between two transfer arm assemblies 30 and 31. In FIG. 5, the wafer 1 is delivered between transfer arm driving assemblies 30 and 31. The wafer 1 is attracted to an electrostatic attraction section 32 of the transfer arm 30A. The wafer 1 is delivered from the transfer arm 30A to an electrostatic attraction section 33 provided on the transfer arm 31A. As shown in FIG. 6, because one electrostatic attraction section is circular and the other electrostatic attraction section is horseshoe shaped, the sections electrostatically attract the wafer 1 at the central portion of the wafer without interfering with each other.

After both electrostatic attraction sections move to the central portion of the wafer 1 and the delivery of the wafer 1 is ready to be made as shown in FIG. 6, the transfer arm 30A or 31A is driven in the direction indicated by the arrow as shown in FIG. 5. The driving section for the drive in the direction indicated by the arrow is provided by an arm driving section such as 26 shown in FIG. 4. While both electrostatic attraction sections 32 and 33 are in contact with the back of the wafer 1, a high DC voltage is applied to the electrostatic attraction section 33 to which the wafer 1 is to be delivered, and the application of the high DC voltage to the electrostatic attraction section 32 is stopped. Thereby, the wafer 1 is held by the electrostatic attraction section 33. Then, the wafer 1 is delivered to the transfer arm 31A by driving the transfer arm 30A or 31A in the direction indicated by the arrows as shown in FIG. 5.

By repeating the above steps, it is possible to transfer wafers successively. For the delivery of a wafer from a transfer arm to a wafer holding device, it is effective to provide an electrostatic attraction section movable in the direction normal to the wafer to the wafer holding device. For example, it is possible to use the transfer arm 31A in FIG. 5 as a wafer holding device. Though the position where the wafer is electrostatically attracted is the central portion of the wafer in the case of FIG. 6, any position at the back of the wafer may be used at which the same attraction force is produced for holding and transferring the wafer. Therefore, it is unnecessary to provide the horseshoe electrostatic attraction section of FIG. 6 and to deliver a wafer by attracting the wafer at its both ends. In this case, both electrostatic attraction sections can be circular, and the sizes of both electrostatic attraction sections can be arbitrarily determined as long as they are small enough to be adapted to the size of the wafer.

Though the sizes of the above-mentioned electrostatic attraction sections of the present invention are large compared to the thickness of a wafer, it is unnecessary to make the thicknesses of the electrostatic attraction sections larger than the thickness (e.g. 1 mm) of the wafer. The thickness of the wafer can be any value as long as the wafer does not cause dielectric breakdown even if a high DC voltage is applied to the wafer. In the case of alumina, a thickness of hundreds of microns is good enough. It is necessary that the member forming an electrostatic attraction layer is thick enough in view of strength. In the case of aluminum, even the thickness of 1 mm is allowable though depending on the construction of a transfer arm. Such thin electrostatic attraction sections are necessary to take wafers out of a cassette or put them in the cassette. In practical contemplated electrostatic chucking systems, the applied voltage is in the range of 200–400 v and the holding force is about 1 kg/cm2 of wafer/chuck contact area. Thus, a 12" wafer weighing about 100 gm can be held even by contact only at the wafer edge.

Figure 7:
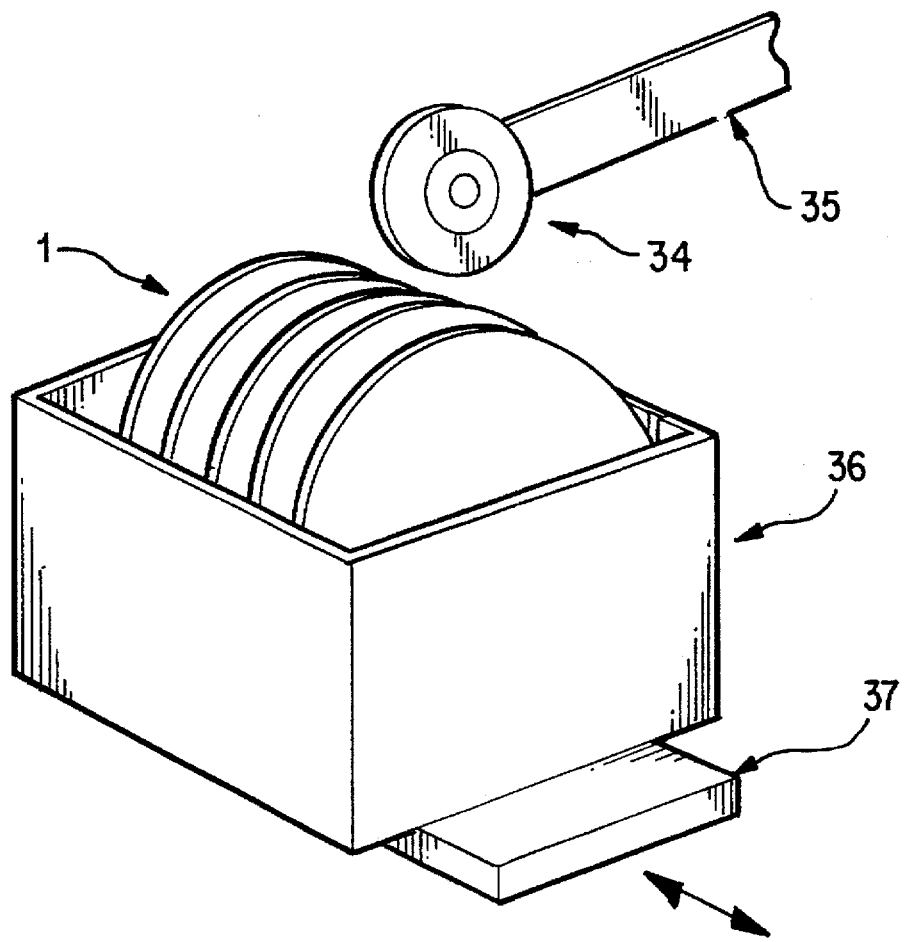
FIG. 7 is a schematic illustration showing a wafer being taken out of a cassette with an electrostatic chucking transfer system according to the present invention.

FIG. 7 schematically shows an example of wafers being moved in and out of a cassette. A thin electrostatic attraction section 34 is inserted between wafers stored in a cassette 36 by a transfer arm 35. The thickness of the electrostatic attraction section 34 is smaller than the dimension between the wafers stored in the cassette 36. Therefore, the electrostatic attraction section is inserted up to the central portion of the wafer 1 (though the electrostatic attraction section may be inserted only to the peripheral part of the wafer 1)

without contacting the wafer 1. Then, the cassette 36 is moved together with the wafers 1 by a cassette driving part 37 in one of the directions indicated by the arrow toward the back of the wafer 1 to be taken out. The back of the wafer 1 comes in contact with the electrostatic attraction section 34 due to the movement of the cassette 36 and a high DC voltage is applied to the electrostatic attraction section. Thereby, the wafer 1 is held by the electrostatic attraction section 34. Then, the transfer arm 35 is moved and the wafer 1 is taken out of the cassette 36. To store the wafer 1 back in the cassette 36, the reverse procedure is performed. In the procedure in which the cassette 37 moves in the direction indicated by the arrow in FIG. 7 to bring the electrostatic attraction section 34 into contact with the back of a wafer, it is also possible to move the wafer transfer arm 35 in the direction indicated by the arrow and not move the cassette driving section. This is the same procedure as that described with reference to FIG. 5. In this case, the role of the cassette driving section 37 is to move the cassette 36 so that the position of a wafer to be transferred enters the extent where the transfer arm 35 is movable.

Figure 8:
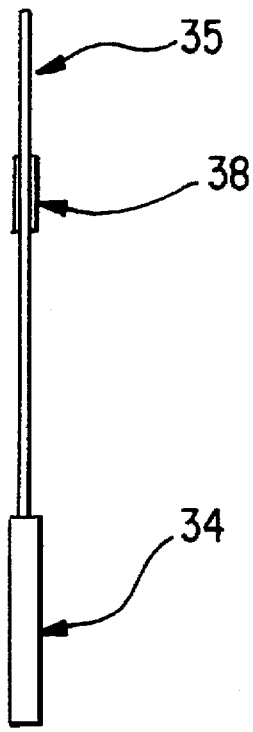
FIG. 8 is an illustration showing a strain sensor provided for the transfer arm of FIG. 7.

When a thin transfer arm 35 as shown in FIG. 7 is used, the transfer arm vibrates while it moves, and thereby problems such as the contact of the wafer with other members may occur. Therefore, a strain sensor 38 shown in FIG. 8 is provided in order to detect the degree of vibration and control the movement of the transfer arm 35. The strain sensor 38 makes it possible to measure the amount of deflection of the arm, that, is, the vibration amplitude by detecting the strain of the transfer arm 35. Moreover, the strain sensor 38 makes it possible to monitor the contact state between the back of a wafer and the electrostatic attraction section 34 when the wafer is delivered. Therefore, the output of the sensor 38 can also be used as a signal for controlling the movement of the transfer arm 35 at the time of wafer delivery or the movement of the cassette driving section 37.

Figure 9:
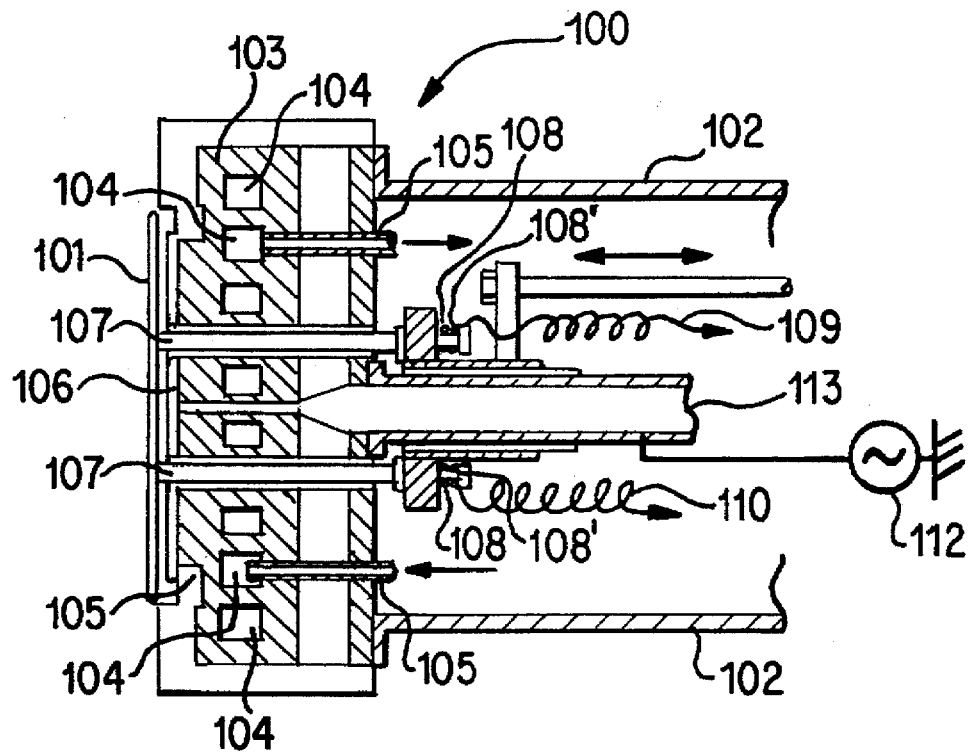
FIG. 9 is a sectional schematic view showing another preferred embodiment of an electrostatic wafer holder for use in a plasma etching process.

FIG. 9 is a sectional view of a preferred embodiment of a wafer holder for use with plasma processing. The above-mentioned U.S. Pat. Nos. 5,007,981 and 4,565,601, contain further details of such a plasma processing system.

Referring to FIG. 9, a wafer 101 is held by a wafer holder or chuck 100. The chuck 106 includes an electrode support 102 for supporting the chuck electrode. A support block 103 is provided which has coolant passages 104 which are communicated with a coolant supply 105 to facilitate circulating flow of coolant therethrough. An outer side insulator film 105 for electrostatic clamping and an inner side insulator film 106 for electrostatic clamping is provided on the block 104 facing the wafer 101. Wafer support pins 107 made of insulator material are provided as support pins which are supported by a gap 108 with spring 108' to accommodate a soft contacting of the wafer on the insulator film. Leads 109 and 110 are provided for the electrostatic clamping voltage supply. A wafer transfer rod 111 is connected for accommodating transfer of the wafer chuck 100 and wafer 101 carried thereby. An RF power supply 112 for applying bias voltage is provided, and a helium gas supply 113 is provided centrally of the chuck.

The manipulation and operation of the FIG. 9 chucking arrangement 100 can be carried out by appropriate movement of the wafer transfer rod 111. Due to the required thickness of the chuck block 104 to accommodate the cooling of the wafers for the plasma processing, the manipulation of multiple wafers is limited as compared to the embodiments of FIGS. 1–8.

As described above, by adopting the wafer transfer method using electrostatic attraction, it is possible to constitute the apparatus having a minimal floor area regardless of the wafer size. Of course, the apparatus area in the direction corresponding to the wafer surface area (the area in the vertical direction) increases. However, the increase of the apparatus area is allowable when considering the ratio of the size of the ceiling of the clean room where the apparatus is installed to the wafer size. Even if the diameter of the wafer increases, it is possible to transfer the large-diameter wafer by replacing a container in a transfer chamber or remodeling the apparatus and therefore, there is a possibility that the processing apparatus can be used for many device generations of different wafer sizes.

Furthermore, slip between the wafer and the electrostatic attraction member hardly occurs because the wafer is firmly secured. Therefore, high-speed wafer transfer can be realized using the electrostatic chucking system of the present invention.

According to the present invention the footprints of the wafer processing apparatus and the transfer system can be maintained small even if the diameter of the wafer increases, and hence it has an effect that the area exclusively occupied by the clean room can be decreased. Moreover, because the footprint of the wafer processing apparatus hardly changes even if the wafer diameter increases, the size of the transfer system can previously be determined so that wafers having sizes for the next generation can be transferred and the apparatus can be used in the next generation by changing the container of the transfer system of the wafer processing apparatus. Therefore, the present invention minimizes the cost of the system while accommodating a wide range of wafer sizes. It is unnecessary to contact the wafer front surface to be processed since the electrostatic attraction method is adopted to hold a wafer in the transfer system, and therefore the present invention has an advantage that foreign matters hardly adhere to the wafer front surfaces. Furthermore, the present invention has an effect that no foreign matter adheres to the wafer processed surface because the wafer surface is vertical even if any foreign matter falls onto the wafer surface from above the wafer during the transfer or processing of the wafer and thereby the wafer processing yield is improved.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Apparatus for handling a semi-conductor wafer which has a front face and a rear face, comprising:

a first electrostatic chucking device engageable with said rear face to hold said wafer in a vertically oriented position with said faces extending vertically, and a second electrostatic chucking device and a transfer mechanism effective to transfer the wafer from said first electrostatic chucking device to said second chucking device.

2. Apparatus according to claim 1, wherein first electrostatic chucking device includes relatively movable electrodes engageable with said rear face, and a cushion interposed between the electrodes and the rear face to cushion relative movements during electrostatic chucking of said wafer.

3. Apparatus according to claim 2, wherein said cushion includes spring means.

4. Apparatus according to claim 1, comprising:

a wafer treatment station for treating the front face, and a first movable transfer arm for carrying the first chucking device between a wafer supply station and the treatment station while maintaining the wafer in said vertically oriented position.

5. Apparatus for handling a semi-conductor wafer which has a front face and a rear face, comprising:

a first electrostatic chucking device engageable with said rear face to hold said wafer in a vertically oriented position with said faces extending vertically;

a first movable transfer arm carrying the first chucking device;

a second movable transfer arm carrying a second electrostatic chucking device; and an electrostatic chucking force transfer mechanism to transfer the wafer from the first chucking device to the second chucking device.

6. Apparatus according to claim 5, wherein the first electrostatic chucking device includes relatively movable electrodes engageable with said rear face, and a cushion interposed between the electrodes and the rear face to cushion relative movements during electrostatic chucking of said wafer.

7. Apparatus according to claim 6, wherein said cushion includes spring means.

8. Apparatus for handling a semiconductor which has a front face and a rear face, comprising:

a first electrostatic chucking device engageable with said rear face to hold said wafer in a vertically oriented position with said faces extending vertically, a movable transfer arm for carrying the first chucking device between different wafer handling positions while maintaining said wafer in said vertically oriented position, a second electrostatic chucking device carried by a second movable transfer arm,, and a transfer mechanism to transfer the wafer from said first electrostatic chucking device to the second electrostatic chucking device.

9. Apparatus according to claim 8, wherein said second transfer arm is operable to remove the wafer from the treatment station to a discharge station, while maintaining said wafer in said vertically oriented position.

10. Apparatus according to claim 9, wherein said transfer arms and chucking devices are operable to move said wafer in a common horizontal plane between said supply station, treatment station and discharge station.

11. Apparatus for treating a semiconductor wafer which has a front and a rear face, comprising:

a first movable transfer arm comprising a first electrostatic chucking device engageable with said rear face to hold said wafer in a vertically oriented position with said faces extending vertically;

a second movable transfer arm comprising a second electrostatic chucking device;

an electrostatic chucking force transfer mechanism to effect transfer of the wafer between the first electrostatic chucking device and the second electrostatic chucking device; and a wafer treating station having a wafer treating chamber in which the wafer is held and treated on a holding device in a vertically oriented position.

\* \* \* \* \*